(12) United States Patent
Ahn et al.

(10) Patent No.: US 8,491,982 B2
(45) Date of Patent: Jul. 23, 2013

(54) APPARATUS FOR MANUFACTURING BONDING STRUCTURE, BONDING STRUCTURE AND METHOD OF FABRICATING THE SAME (75) Inventors: Eunchul Ahn, Yongin-Si (KR); Yun-Rae Cho, Seoul (KR); TaeSung Yoon, Cheonan-Si (KR); Youngmin Lee, Asan-Si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 116 days.

(21) Appl. No.: 13/009,390

(22) Filed: Jan. 19, 2011

(65) Prior Publication Data
US 2011/0186220 A1 Aug. 4, 2011

(30) Foreign Application Priority Data
Feb. 3, 2010 (KR) .......................... 10-2010-0010064

(51) Int. Cl.
*H05K 1/02* (2006.01)
(52) U.S. Cl.
USPC ............ 428/119; 257/738; 257/780; 257/784

(58) Field of Classification Search
CPC ......................................................... H05K 1/02
USPC ................... 428/98, 119; 257/780, 784, 738
See application file for complete search history.

(56) References Cited

U.S. PATENT DOCUMENTS

| 7,808,116 B2* | 10/2010 | Mii et al. ................. 257/784 |
| 2001/0001508 A1* | 5/2001 | Garrity et al. .............. 257/780 |
| 2007/0290340 A1 | 12/2007 | Hsueh et al. |
| 2009/0098723 A1 | 4/2009 | Yu |

FOREIGN PATENT DOCUMENTS

| JP | 7-058113 A | 3/1995 |
| KR | 10-0277850 | 9/1999 |

* cited by examiner

*Primary Examiner* — Alexander Thomas
(74) *Attorney, Agent, or Firm* — Harness, Dickey & Pierce P.L.C.

(57) ABSTRACT

Provided is an apparatus for manufacturing a bonding structure, a bonding structure, and a method of fabricating the same. The bonding structure includes a pad including an upper surface with a first area, a ball adhered to the upper surface of the pad, and a wire extending from the ball. An adhesion surface of the ball adhered to the pad may have substantially the same shape as that of the upper surface of the pad.

8 Claims, 13 Drawing Sheets

APPARATUS FOR MANUFACTURING BONDING STRUCTURE, BONDING STRUCTURE AND METHOD OF FABRICATING THE SAME

CROSS-REFERENCE TO RELATED APPLICATIONS

This U.S. non-provisional patent application claims priority under 35 U.S.C. §119 to Korean Patent Application 10-2010-0010064, filed on Feb. 3, 2010, in the Korean Intellectual Property Office (KIPO), the entire contents of which are hereby incorporated by reference.

BACKGROUND

1. Field

Example embodiments relate to an apparatus for manufacturing a bonding structure, a bonding structure, and a method of fabricating the same, and more particularly, to an apparatus for manufacturing a bonding structure used to electrically connect a circuit board and a substrate to each other, a bonding structure, and a method of fabricating the same.

2. Background

Among conventional technologies of fabricating semiconductor packages, there is known a wire bonding technology of electrically connecting a substrate and a circuit board to each other using a bonding wire. In recent years, a pad formed on a substrate has been decreased in size in order to meet a demand for decreasing the size of a semiconductor element. For this reason, a ball bonded to the pad has been gradually decreased in size with the decrease in the size of the pad. Accordingly, a contact area between the pad and the ball relatively becomes small and thus a failure in wire bonding may increase.

SUMMARY

Example embodiments provide an apparatus for manufacturing a bonding structure and increasing a contact area between a pad and a ball.

Example embodiments also provide a bonding structure having a broader contact area between a pad and a ball.

Example embodiments also to provide a method of fabricating a bonding structure having an increased contact area between a pad and a ball.

Example embodiments provide an apparatus for manufacturing a bonding structure. Specifically, the apparatus for manufacturing the bonding structure may include a body including a first through hole, a tip part disposed in a lower end of the body and including a second through hole in communication with the first through hole, and a chamfer in communication with the second through hole located at a lower end of the tip part to face a pad formed on a substrate, wherein a horizontal cross-section of the chamfer may have substantially the same shape as that of an upper surface of the pad.

In example embodiments, the upper surface of the pad may be square.

In example embodiments, the horizontal cross-sections of the first and second through holes may be circular.

In example embodiments, the diameter of the first through hole may be decreased downward. In example embodiments, the second through hole may include an upper part having a diameter decreased downward and a lower part having a uniform diameter. The diameter of the chamfer may be increased downward.

Example embodiments also provide a bonding structure. The bonding structure may include a pad including an upper surface with a first area, a ball adhered to the upper surface of the pad, and a wire extending from the ball, wherein an adhesion surface of the ball adhered to the pad may have the same shape as that of the upper surface of the pad.

In example embodiments, the upper surface of the pad may be square. The adhesion surface of the ball may be square. The square shape of the adhesion surface of the ball may have round corners.

In example embodiments, the width of the wire may be smaller than that of the ball.

In example embodiments, the bonding structure may further include a neck part disposed between the ball and the wire.

Example embodiments also provide a method of fabricating a bonding structure. The method of fabricating the bonding structure may include: forming a pad including an upper surface with a first area on a substrate, adhering a ball to the upper surface of the pad using a capillary, and extending a wire from the adhered ball, wherein an adhesion surface of the ball adhered to the pad may have the same shape as that of the upper surface of the pad.

In example embodiments, the adhering of the ball to the upper surface of the pad may include forming a preliminary ball in a chamfer of the capillary, and adhering the preliminary ball to the upper surface of the pad by moving the capillary downward so as to form the ball. The horizontal cross-section of the chamfer may have the same shape as that of the upper surface of the pad, and the horizontal cross-section of the preliminary ball may have the same shape as that of the horizontal cross-section of the chamfer.

In example embodiments, the forming of the pad on the substrate may include forming a pad with a square upper surface on the substrate.

Further, the adhering of the ball to the upper surface of the pad may include adhering a ball with a square adhesion surface to the upper surface of the pad, and the square adhesion surface of the ball may have round corners.

In example embodiments, the extending of the wire from the adhered ball may include extending a wire having a width smaller than that of the ball.

In example embodiments, the method may further include forming a neck part on the ball after adhering the ball to the upper surface of the pad, wherein the wire may extend from the neck part.

BRIEF DESCRIPTION OF THE DRAWINGS

The accompanying drawings are included to provide a further understanding of example embodiments, and are incorporated in and constitute a part of the specification. The drawings illustrate example embodiments and, together with the description, serve to explain principles of the inventive concepts. In the drawings.

DETAILED DESCRIPTION OF EXAMPLE EMBODIMENTS

Goals, other goals, features, and advantages of example embodiments and methods of accomplishing the same may be understood more readily by reference to the following detailed description of example embodiments and the accompanying drawings. Inventive concepts may, however, be embodied in many different forms and should not be construed as limited to the example embodiments set forth herein. Rather, example embodiments are provided so that the inventive concepts will be thorough and complete, and will fully convey the scope of this inventive concepts to those skilled in the art.

In the disclosure, it will be understood that when any element is referred to as being "on" another element, it may be directly on another element or a third element may be interposed therebetween. In addition, in the drawings, the thickness of the constituent is exaggerated for the effective description of the technical contents.

Example embodiments described in the disclosure will be explained with reference to the ideal and exemplary cross-sectional views and/or the plan views. In the drawings, the thicknesses of the layers and the areas are exaggerated for the effective description of the technical contents. Accordingly, the contents of the exemplary drawings may be modified in accordance with the fabrication method and/or the allowance. Accordingly, example embodiments are not limited to the particular contents illustrated in the drawings, but include the contents of the modification in accordance with the fabrication process. For example, the perpendicularly illustrated etching area may be round or have a predetermined curvature. Accordingly, the areas illustrated in the drawings have properties, and the shapes of the areas illustrated in the drawings are for the purpose of describing particular shapes only and are not intended to be limiting of the scope of example embodiments. In example embodiments, the terminologies of the first, second, etc. are used to describe the constituents. However, these constituents are not limited to the terminologies, and these terminologies are merely used to distinguish a certain constituent from another constituent. Example embodiments illustrated herein include the complementary embodiments thereof.

The terminology used in the specification is for the purpose of describing example embodiments only and is not intended to be limiting of the inventive concepts. In the specification, the singular forms are intended to include the plural forms as well, unless the context clearly indicates otherwise. It will be further understood that the terms "comprises" and/or "comprising," or "includes" and/or "including," do not preclude the presence or addition of one or more other elements.

Hereinafter, example embodiments will be described in detail with reference to the drawings.

Apparatus for Manufacturing Bonding Structure

Figure 1:
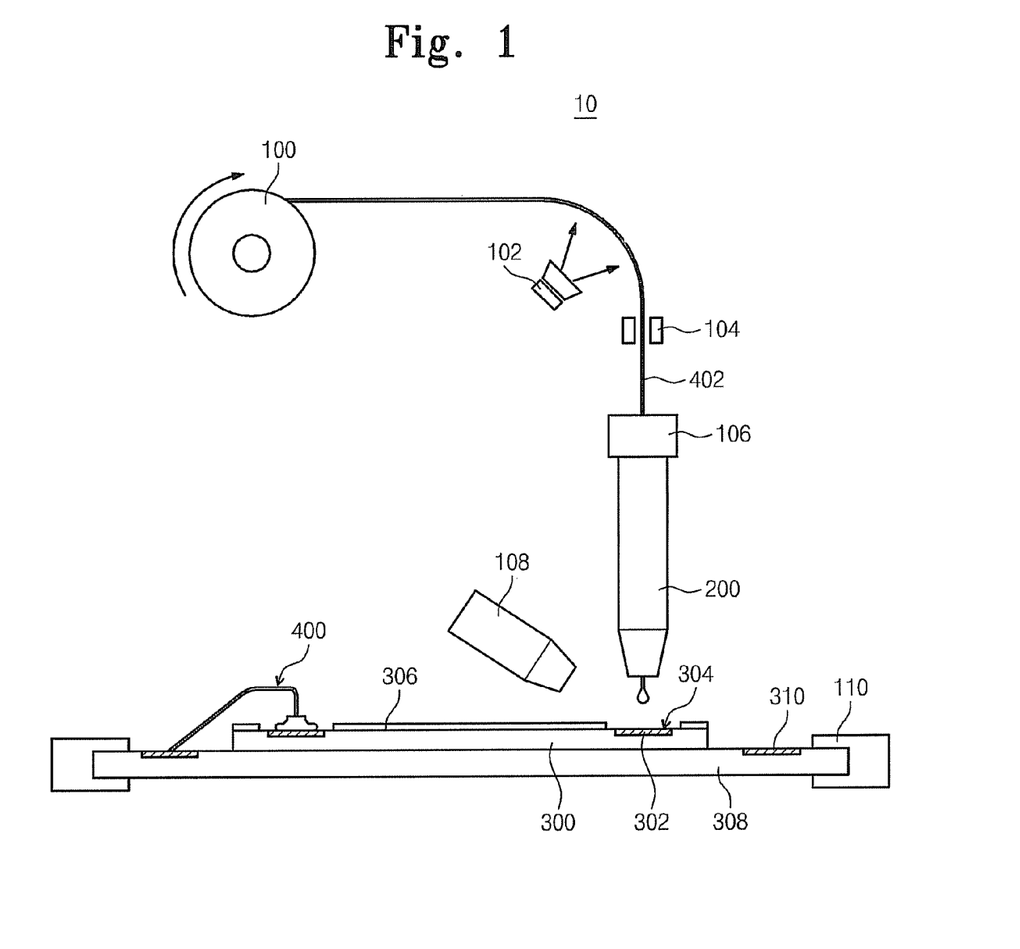
FIG. 1 is a cross-sectional view illustrating an apparatus for manufacturing a bonding structure according to example embodiments.
Figure 2A:
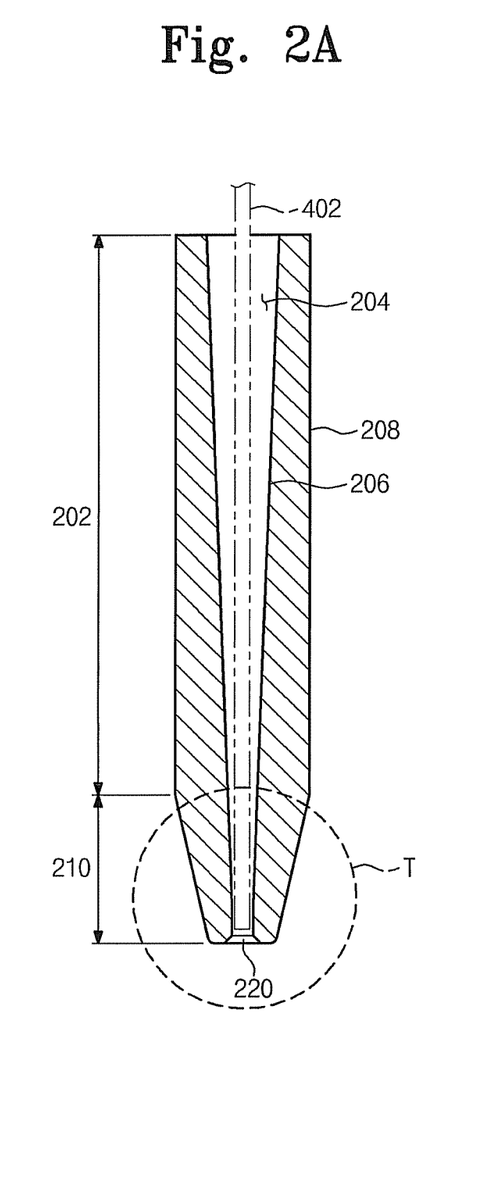
FIG. 2A is a cross-sectional view illustrating a capillary of the apparatus for manufacturing the bonding structure in FIG. 1.
Figure 2B:
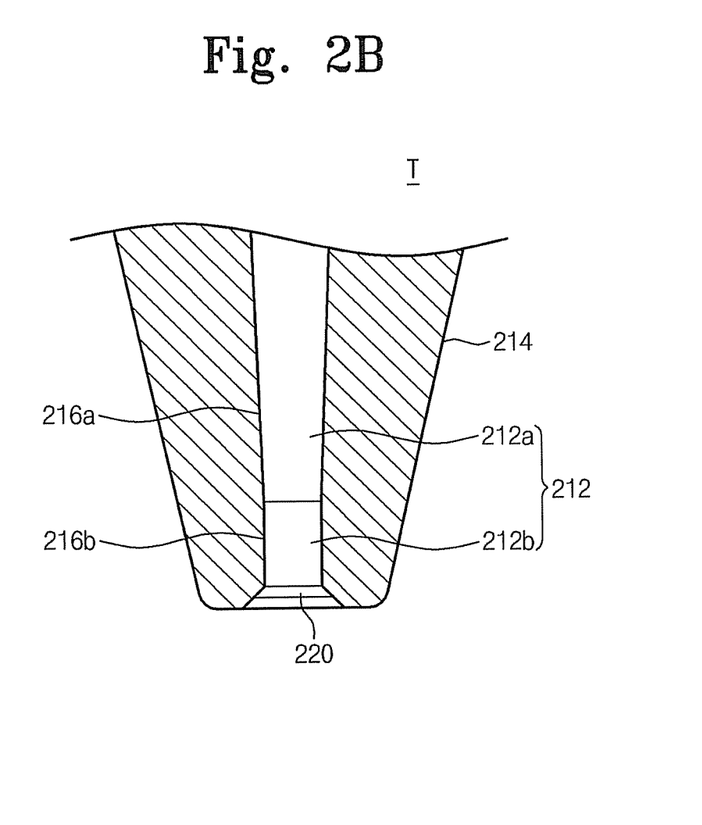
FIG. 2B is an enlarged cross-sectional view illustrating a part T of the capillary in FIG. 2A.
Figure 2C:
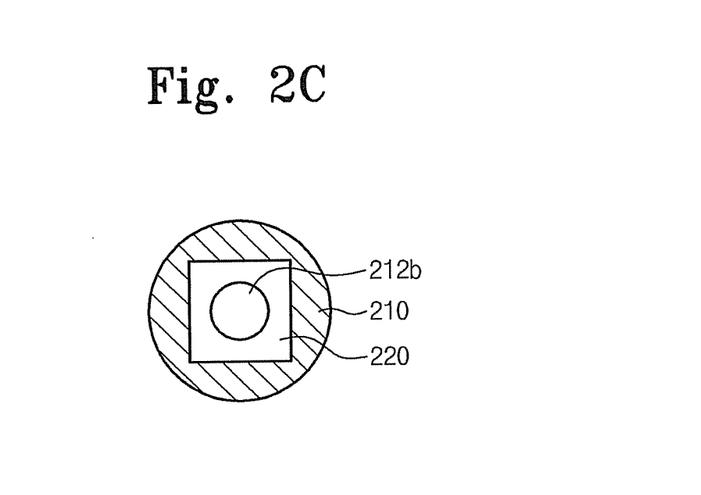
FIG. 2C is a plan view illustrating the part T in FIG. 2B.

FIG. 1 is a cross-sectional view illustrating an apparatus for manufacturing a bonding structure according to example embodiments. FIG. 2A is a cross-sectional view illustrating a capillary of the apparatus for manufacturing the bonding structure illustrated in FIG. 1. FIG. 2B is an enlarged cross-sectional view illustrating a part T of the capillary illustrated in FIG. 2A. FIG. 2C is a plan view illustrating the part T illustrated in FIG. 2B, where FIG. 2C is a plan view when the lower end of the capillary illustrated in FIG. 2B is seen from the lower side thereof.

Referring to FIG. 1, an apparatus 10 for manufacturing a bonding structure may include a wire spool 100, a capillary 200, a transducer 106, a torch 108, and a transfer rail 110.

The lower end of an original wire 402 drawn out from the wire spool 100 may be inserted into the capillary 200. An air tension part 102 and a wire clamp 104 may further be disposed between the wire spool 100 and the capillary 200.

The air tension part 102 may supply air to the original wire 402 drawn out from the wire spool 100 to maintain the original wire 402 with a fixed tension. The wire clamp 104 may support and guide the original wire 402 passing through the air tension part 102 to the capillary 200.

The transducer 106 may be disposed between the wire clamp 104 and the capillary 200. In particular, the transducer 106 may be adjacent to the capillary 200. The transducer 106 may transmit energy, which is generated from an ultrasonic wave generating unit (not illustrated), to the capillary 200.

The torch 108 may be adjacent to be distant from the capillary 200 by a predetermined distance. Electrical sparks may be generated from the distal end of the torch 108, and the lower end of the original wire 402 may be partially melted by high heat generated at this time to be formed in the form of a ball. Accordingly, the torch 108 may be distant from the capillary 200 by a distance corresponding to the degree of transmitting the high heat to the lower end of the original wire 402.

The torch 108 may be formed in a semi-circular shape, a circular shape, or a circular shape having a partially opened part to enclose the wire drawn out from the capillary 200.

The transfer rail 110 may be located to face the lower end of the capillary 200. The transfer rail 110 may support and move a circuit board 308. The circuit board 308 may include a connection pad 310. In addition, a substrate 300 may be mounted on the circuit board 308 to expose the connection pad 310. The substrate 300 may include a pad 302. The apparatus 10 for manufacturing the bonding structure may electrically connect the circuit board 308 to the substrate 300 by connecting the connection pad 310 and the pad 302 to a bonding structure 400. The detailed description thereof will be described in more detail below.

Referring to FIGS. 2A through 2C, the capillary 200 may include a body 202, a tip part 210 disposed in the lower part of the body 202, and a chamfer 220 located at the lower end of the tip part 210.

The body 202 may have a cylindrical shape including a first through hole 204 perforating the center thereof. The first through hole 204 may extend in the longitudinal direction of the body 202. The first through hole 204 may include a circular horizontal cross-section. The diameter of the first through hole 204 may be decreased substantially at the lower part of the body 202.

The body 202 may include an inner wall 206 with an inclined surface and an outer wall 208 with a vertical surface. The diameter of the inner wall 206 of the body 202 may be decreased substantially at its lower part. In example embodiments, it is assumed that the inner wall 206 of the body 202 includes a positively inclined surface.

The original wire 402 may be inserted through the first through hole 204 of the body 202. Accordingly, the diameter of the lowermost end of the first through hole 204 may be substantially equal to or larger than the diameter of the original wire 402. In addition, the body 202 may perform a function of supporting the original wire 402 while the bonding structure is completed on the pad 302.

The tip part 210 may be disposed in the lower end of the body 202. The tip part 210 may have a cylindrical shape including a second through hole 212 perforating the center thereof. In example embodiments, the tip part 210 may be connected to the lower part of the body 202, and the second through hole 212 may communicate with the lower part of the first through hole 204.

The second through hole 212 may extend in the longitudinal direction of the tip part 210, and have a circular horizontal cross-section. The second through hole 212 may include an upper part 212a having a diameter decreased substantially downward and a lower part 212b having a uniform diameter.

The tip part 210 may include an outer wall 214 with an inclined surface, a first inner wall 216a with an inclined surface, and a second inner wall 216b with a vertical surface. The outer wall 214 of the tip part 210 may have a diameter decreased substantially downward. That is, the outer wall 214 of the tip part 210 may include a positively inclined surface. The first inner wall 216a of the tip part 210 may have a diameter decreased substantially downward. The first inner wall 216a of the tip part 210 may also include a positively inclined surface. The second inner wall 216b of the tip part 210 may extend from the lower part of the first inner wall 216a, and have a uniform diameter. In example embodiments, the first inner wall 216a of the tip part 210 may define the upper part 212a of the second through hole 212. The second inner wall 216b of the tip part 210 may define the lower part 212b of the second through hole 212.

The chamfer 220 may be located at the lower end of the tip part 210. The chamfer 220 may communicate with the lower part of the second through hole 212. The chamfer 220 may have a diameter increased downward. That is, the chamfer 220 may include a negatively inclined surface.

The chamfer 220 may be located to face the pad 302 formed on the substrate 300. When the pad 302 has a first area, the chamfer 220 may have an area substantially smaller than the first area. In addition, the horizontal cross-section of the chamfer 220 may have substantially the same shape as that of the upper surface of the pad 302. According to example embodiments, when the pad 302 formed on the substrate 300 has a square shape, the horizontal cross-section of the chamfer 220 may have a square shape.

Bonding Structure

Figure 3A:
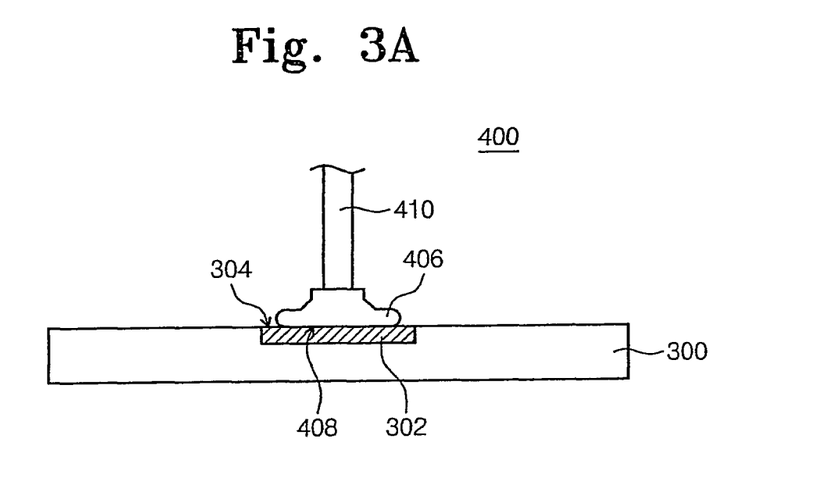
FIG. 3A is a cross-sectional view illustrating a bonding structure according to example embodiments.
Figure 3B:
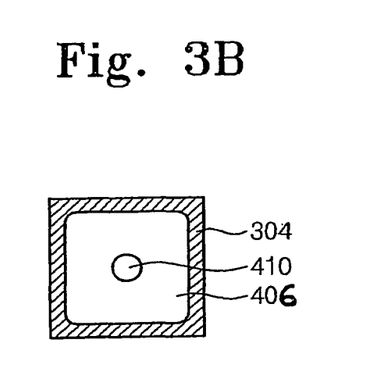
FIG. 3B is a plan view illustrating the bonding structure in FIG. 3A.
Figure 4:
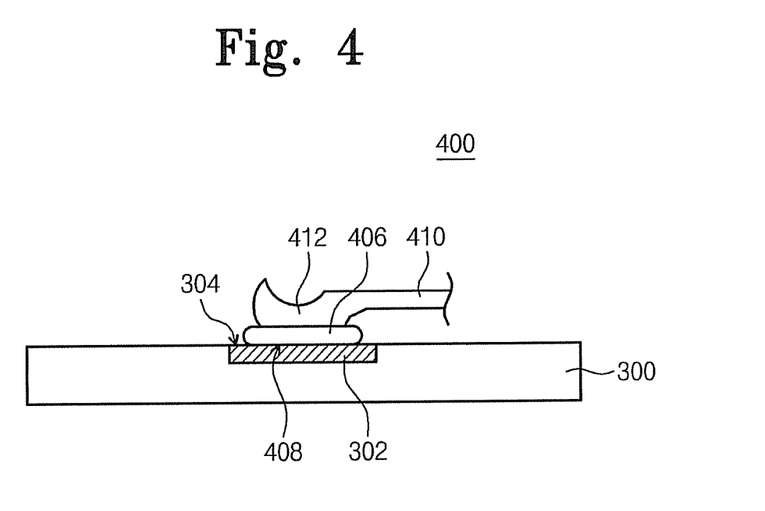
FIG. 4 is a cross-sectional view illustrating a bonding structure according to example embodiments.

FIG. 3A is a cross-sectional view illustrating a bonding structure according to example embodiments. FIG. 3B is a plan view illustrating the bonding structure in FIG. 3A. FIG. 3B shows the bonding structure in FIG. 3A viewed from the upside. FIG. 4 is a cross-sectional view illustrating a bonding structure according to example embodiments.

Referring to FIGS. 1, 3A, and 3B, a bonding structure 400 may include the pad 302 formed on the substrate 300, a ball 406 adhered to an upper surface 304 of the pad 302, and a wire 410 extending from the ball 406.

The substrate 300 may be mounted on the circuit board 308. An example of the circuit board 308 includes a PCB (Printed Circuit Board) in which a circuit pattern of copper clad is formed on one or both surfaces of a core formed of reinforced fiber glass or epoxy resin. The circuit pattern may include a pattern (not illustrated) supplying a path of an electrical signal to send or receive data to or from the substrate 300, a pattern (not illustrated) transmitting power to the substrate 300 or grounding the substrate 300, and a pattern (not illustrated) connected to external terminals.

The circuit board 308 may further include the connection pad 310. The connection pad 310 may be electrically connected to an external terminal (not illustrated) such as a solder ball electrically connected to an external electrical device. The connection pad 310 may be formed of copper (Cu), aluminum (Al), nickel (Ni), or gold (Au). The connection pad 310 may be exposed to the outside when the substrate 300 is mounted on the circuit board 308.

The substrate 300 may include a semiconductor chip and the semiconductor chip may be a memory chip or a non-memory chip. The substrate 300 may include an integrated circuit (not illustrated) and the pad 302 electrically connected to the integrated circuit.

The pad 302 may include the upper surface 304 of a first area. The upper surface 304 of the pad 302 may have a circular shape or a polygonal shape. In example embodiments, the pad 302 may include the square upper surface 304.

The number of pads 302 and the positions of the pads 302 may be selected in accordance with the type, the capacity, or the design of the integrated circuit. For example, the number of pads 302 may be plural. In addition, the plurality of pads 302 may be arranged, irregularly, locally, or regularly on the whole. For example, the plurality of pads 302 may be arranged in one or more rows at the center of the substrate 300. The arrangement structure of the pads 302 is referred to as a center pad array. Alternatively, the plurality of pads 302 may be arranged in one or more rows at the edge of the substrate 300. The arrangement structure of the pads 302 is referred to as an edge pad array. As still another example, the plurality of pads 302 may be regularly or irregularly dispersed and arranged throughout the entire substrate 300. The arrangement structure of the pads 302 is referred to as a matrix pad array.

A protection dielectric layer 306 may be further formed on the substrate 300 to protect the substrate 300. The protection dielectric layer 306 may be formed to expose the pad 302. The protection dielectric layer 306 may be formed of, for example, polyimide.

The ball 406 may be adhered to the upper surface 304 of the pad 302. An adhesion surface 408 may be formed on the lower part of the ball 406 adhered to the upper surface 304 of the pad 302. The adhesion surface 408 of the ball 406 may have substantially the same area as the first area. In addition, the adhesion surface 408 of the ball 406 may have substantially the same shape as that of the upper surface 304 of the pad 302. According to example embodiments, when the upper surface 304 of the pad 302 has a square shape, the adhesion surface 408 of the ball 406 may have a substantially square shape. At this time, the square shape of the adhesion surface 408 of the ball 406 may has round (gentle) corners.

When the adhesion surface 408 of the ball 406 has substantially the same shape as that of the upper surface 304 of the pad 302, as illustrated in FIGS. 6A through 6E, which are described below, a contact area between the pad 302 and the ball 406 may be broader, compared to the case where the ball adhesion surface has a shape different from that of the upper surface of the pad. Accordingly, it is possible to improve electrical contact reliability between the pad 302 and the bonding structure 400.

The wire 410 may extend from the ball 406. For example, the wire 410 may extend from the upper surface or the side surface of the ball 406. The wire 410 may have a width substantially narrower than that of the ball 406, and the horizontal cross-section of the wire 410 may be circular.

The extending wire 410 may be adhered to the connection pad 310 of the circuit board 308. For example, the extending wire 410 may be adhered to the connection pad 310 by stitch bonding.

According to example embodiments, in FIG. 4, the bonding structure 400 may further include a neck part 412 formed between the ball 406 and the wire 410. The neck part 412 may extend from the upper part of the ball 406 and have a width substantially wider than that of the wire 410. Such a neck part 412 may further reinforce the connection between the ball 406 and the wire 410.

For example, the neck part 412 may have substantially the same shape as that of the horizontal cross-section of the ball 406. Alternatively, the neck part 412 may have substantially the same shape as the horizontal cross-section of the wire 410.

Method of Fabricating Bonding Structure

Figure 5A:
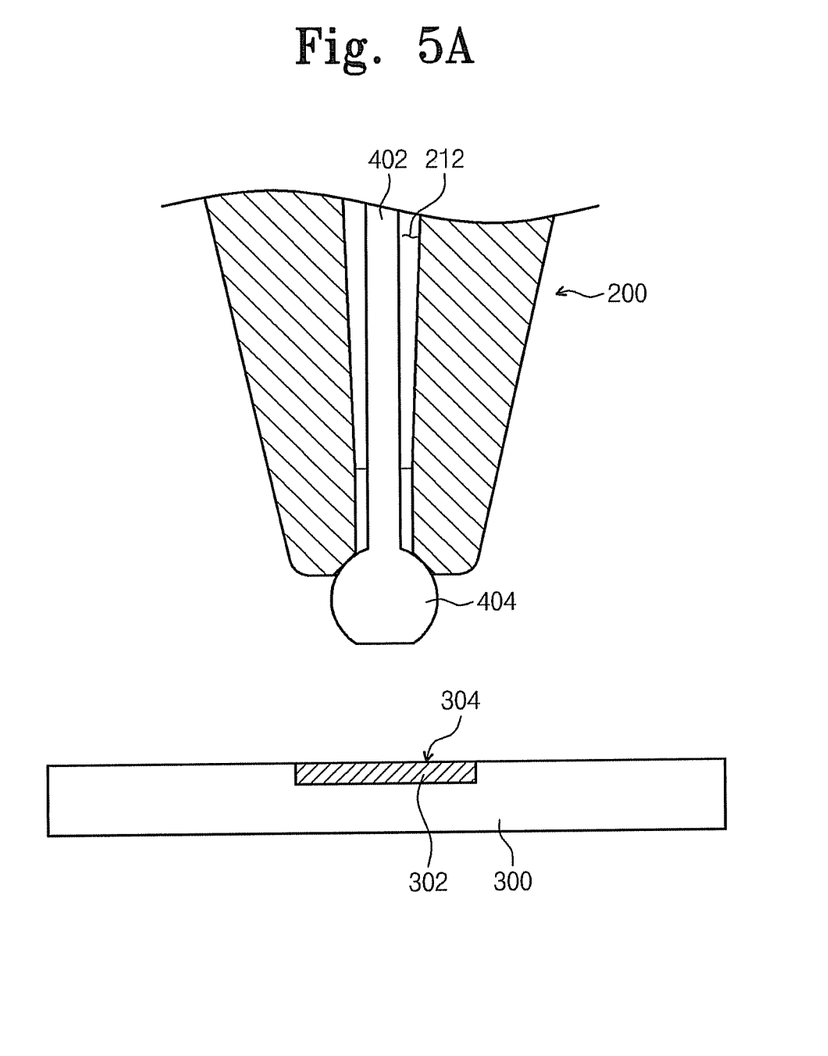
FIGS. 5A through 5C are cross-sectional views illustrating a method of fabricating a bonding structure according to example embodiments.
Figure 5B:
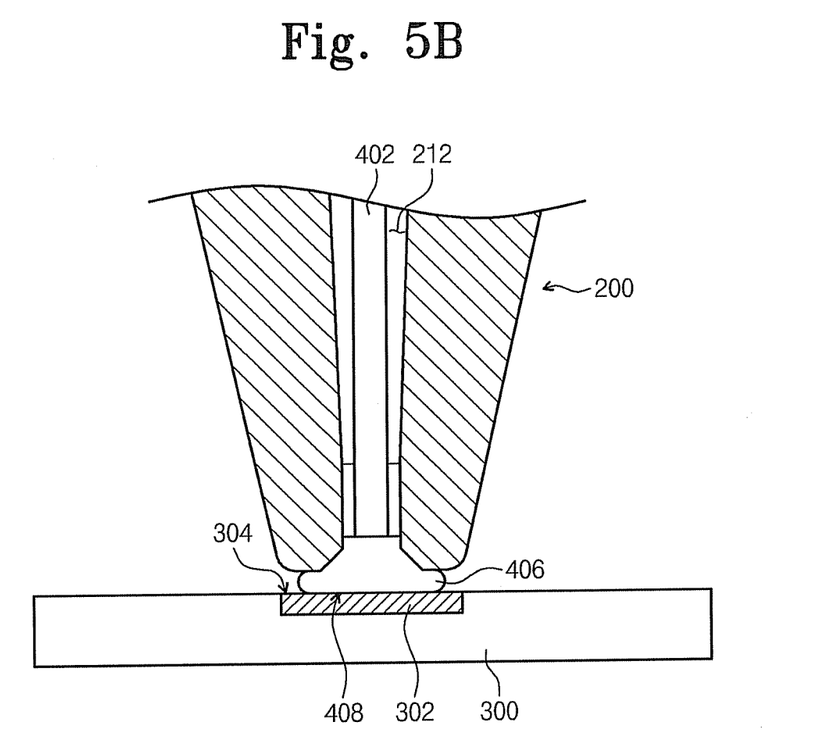
Figure 5C:
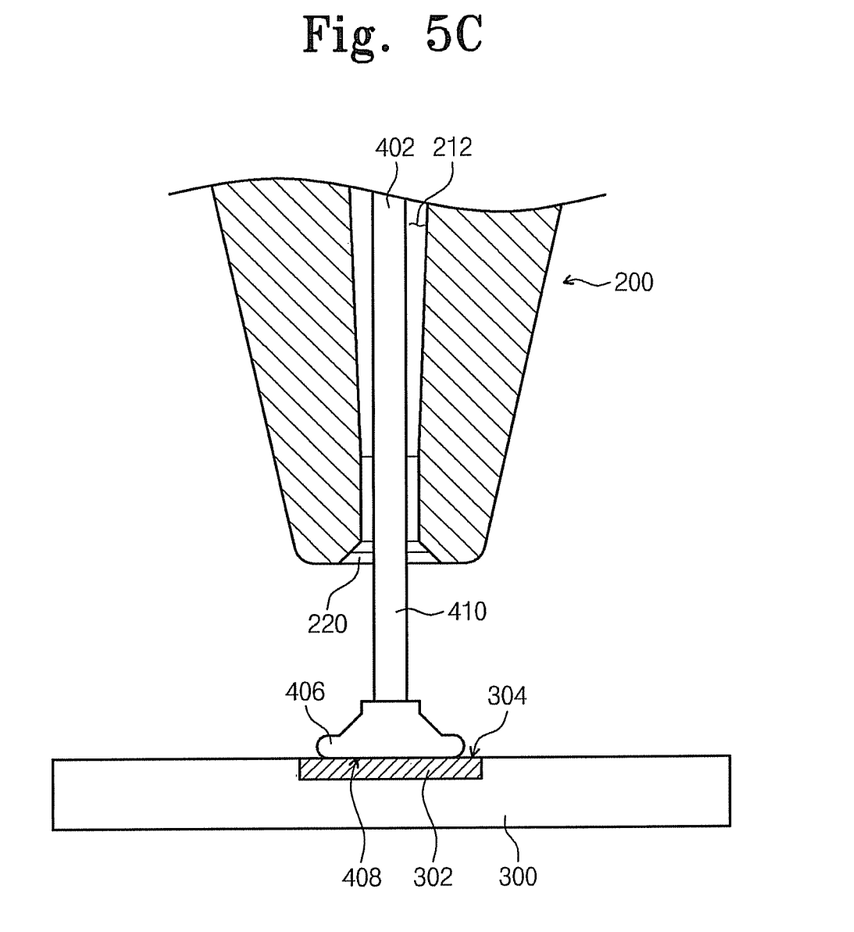

FIGS. 5A through 5C are cross-sectional views illustrating a method of fabricating a bonding structure according to example embodiments.

Referring to FIG. 5A, the substrate 300 is prepared to be mounted on the circuit board 308.

The capillary 200 is prepared into which the original wire 402 is inserted. The original wire 402 may be inserted into the second through hole 212 and the first through hole 204 (see FIG. 2A) of the body 202. The original wire 402 may be supported by the body 202 of the capillary 200. The body 202 of the capillary 200 may support the original wire 402 until the bonding structure is completed.

A preliminary ball 404 is formed at the lower end of the capillary 200. More specifically, the preliminary ball 404 having a minute diameter may be fowled by instantly melting the original wire 402 drawn out to the lower end of the capillary 200. At this time, the lower end of the original wire 402 may be melted by heat generated from the torch 108 (see FIG. 1).

According to example embodiments, the horizontal cross-section of the preliminary ball 404 may have substantially the same shape as that of the horizontal cross-section of the chamfer 220. In addition, the horizontal cross-section of the chamfer 220 may have substantially the same shape as that of the upper surface 304 of the pad 302. Accordingly, the horizontal cross-section of the preliminary ball 404 may have substantially the same shape as that of the upper surface 304 of the pad 302.

For example, when the upper surface 304 of the pad 302 has a square shape, the horizontal cross-section of the preliminary ball 404 may also have a square shape. In addition, the horizontal cross-section of the preliminary ball 404 may have an area substantially smaller than the first area (an area of the upper surface of the pad).

Referring to FIG. 5B, the capillary 200 having the preliminary ball 404 formed thereon is moved, the preliminary ball 404 is adhered to the upper surface 304 of the pad 302, and thus the ball 406 is formed on the pad 302.

More specifically, the capillary 200 having the preliminary ball 404 formed on the lower end thereof may be moved to a position above the pad 302. Subsequently, by moving the capillary 200 downward, the preliminary ball 404 is adhered to the upper surface 304 of the pad 302. By moving the capillary 200 downward, the preliminary ball 404 is expanded in a direction from its center to its edge. Then, the thickness of the preliminary ball 404 becomes thin, and thus may be changed into the ball 406. At this time, the horizontal cross-section of the ball 406 may have substantially the same shape as that of the horizontal cross-section of the preliminary ball 404. In addition, since the horizontal cross-section of the preliminary ball 404 has substantially the same shape as that of the upper surface 304 of the pad 302, the horizontal cross-section of the ball 406 may have substantially the same shape as that of the upper surface 304 of the pad 302.

In addition, the ball 406 may have the adhesion surface 408 adhered to the upper surface 304 of the pad 302. The adhesion surface 408 of the ball 406 may have substantially the same shape as that of the upper surface 304 of the pad 302. The adhesion surface 408 of the ball 406 may have substantially the same area as the first area (an area of the upper surface of the pad).

According to example embodiments, when the upper surface 304 of the pad 302 has a square shape, the adhesion surface 408 of the ball 406 adhered to the pad 302 may have a square shape. At this time, the square shape of the adhesion surface 408 of the ball 406 may have round (gentle) corners.

When the adhesion surface 408 of the ball 406 has substantially the same shape as that of the upper surface 304 of the pad 302, as illustrated in FIGS. 6A through 6E, which are described below, a contact area between the pad 302 and the ball 406 may be broader, compared to the case where the ball adhesion surface has a shape different from that of the upper surface of the pad. Accordingly, it is possible to improve electrical contact reliability between the pad 302 and the bonding structure 400.

Referring to FIG. 5C, the wire 410 extends from the ball 406.

More specifically, after the ball 406 is formed, the wire 410 may extend from the ball 406 by moving the capillary 200 upward or laterally. For example, when the capillary 200 is moved upward, the wire 410 may extend from the upper surface of the ball 406. Alternatively, when the capillary 200 is moved laterally, the wire 410 may extend from the side surface of the ball 406.

Referring to FIG. 1, the extending wire 410 may be adhered to the connection pad 310 of the circuit board 308. For example, the extending wire 410 may be adhered to the connection pad 310 by stitch bonding.

Referring to FIG. 4, according to example embodiments, after the ball 406 is formed, the neck part 412 may further be formed in the ball 406 by moving the capillary 200 vertically or horizontally. The neck part 412 may perform a function of more strongly connecting the ball 406 to the wire 410. In this case, the wire 410 may not extend from the ball 406, but extend from the neck part 412.

Experiment Example

Figure 6A:
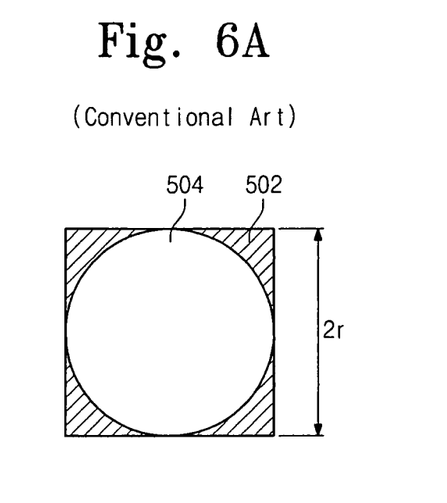
FIGS. 6A and 6C are plan views illustrating a bonding structure according to a conventional technology.
Figure 6B:
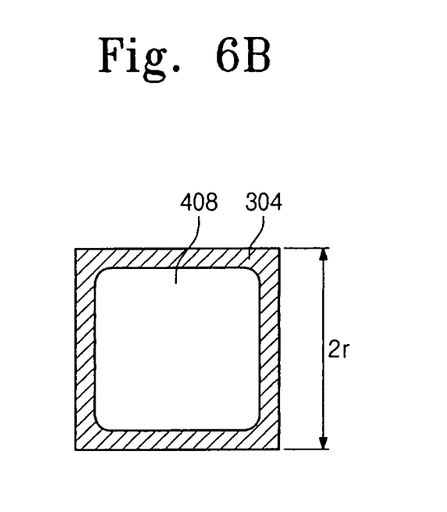
FIGS. 6B, 6D, and 6E are plan views illustrating a bonding structure according to example embodiments.
Figure 6C:
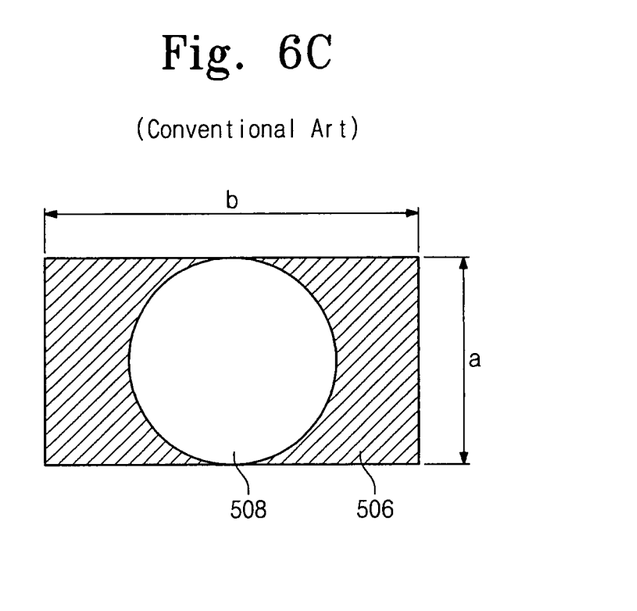
Figure 6D:
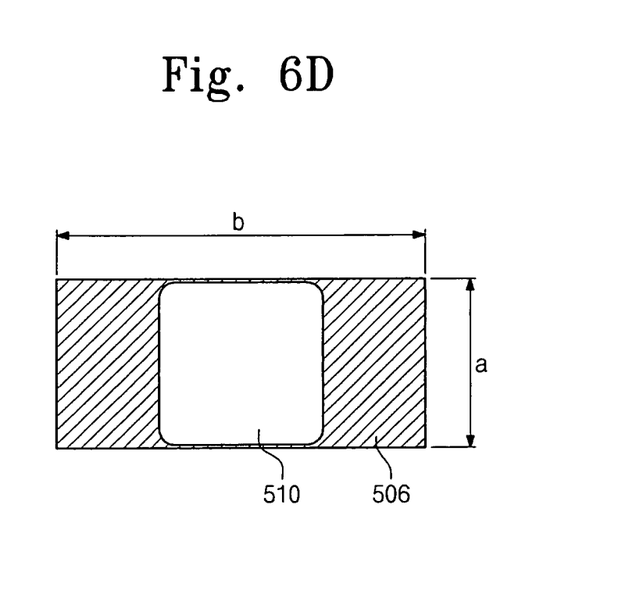
Figure 6E:
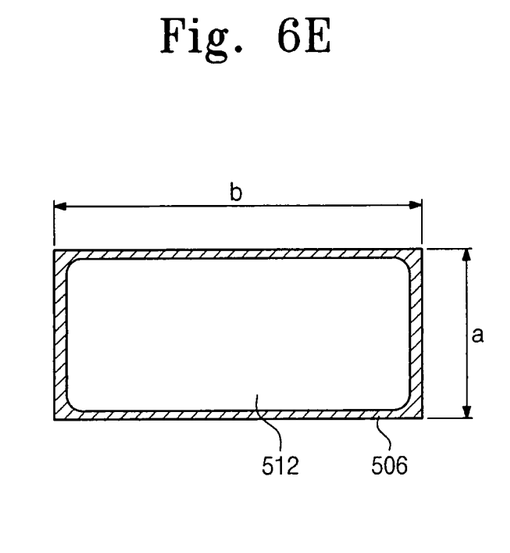

FIGS. 6A and 6C are plan views illustrating a bonding structure according to a conventional technology. FIGS. 6B, 6D, and 6E are plan views illustrating a bonding structure according to example embodiments. FIGS. 6A through 6E show the bonding structure viewed from the upside.

Referring to FIG. 6A, a ball having a circular adhesion surface 504 is adhered to a square pad. On the assumption that 2r is the length of one side of a pad upper surface 502, the maximum adhesion area of the ball formed on the pad is $\pi r^2$. At this time, the area of the pad upper surface 502 is $4r^2$. The maximum adhesion area of the ball formed on the pad is about 78.5% of the pad upper surface 502.

Referring to FIG. 6B, a ball having a square adhesion surface 408 is adhered to a square pad. On the assumption that 2r is the length of one side of a pad upper surface 304, the maximum adhesion area of the ball formed on the pad is about 100% of the pad upper surface 304.

In FIGS. 6A and 6B, it can be known that the adhesion area of the square ball adhesion surface 408 to the pad upper surface 304 is larger by about 21.5% than that of the circular ball adhesion surface 504 to pad upper surface 502. In addition, a difference between the occupation of the square ball adhesion surface 408 to the pad upper surface 304 and the occupation of the circular ball adhesion surface 504 of the pad upper surface 502 is 27%. Therefore, it can be known that the occupation ratio of the square ball adhesion surface 408 is larger than that of the circular ball adhesion surface 504.

Referring to FIG. 6C, a ball having a circular adhesion surface 508 is adhered to a rectangular pad. On the assumption that 'a' is the short side of the pad upper surface 506 and 'b' is the long side of the pad upper surface 506, the maximum ball adhesion area is $\pi a^2/4$. At this time, the area of the pad upper surface 506 is a×b. The maximum adhesion area of the ball formed on the pad is 0.785×a/b of the pad upper surface 506.

Referring to FIG. 6D, a ball having a square adhesion surface 510 is adhered to a rectangular pad. On the assumption that a is the short side of the pad upper surface 506 and b is the long side of the pad upper surface 506, the maximum adhesion area of the ball fowled on the pad is $a^2$. At this time, the area of the pad upper surface 506 is ab. The maximum adhesion area of the ball formed on the pad is a/b of the pad upper surface 506.

In FIGS. 6C and 6D, it can be known that the adhesion area of the square ball adhesion surface 510 to the pad upper surface 506 is larger by about 21.5% than that of the circular ball adhesion surface 508. In addition, a difference between the occupation of the square ball adhesion surface 510 and the occupation of the circular ball adhesion surface 508 to the pad upper surface 506 is a/b (1−π/4). Therefore, it can be known that the occupation ratio of the square ball adhesion surface 510 is larger than that of the circular ball adhesion surface 508.

Referring to FIG. 6E, a ball having a rectangular adhesion surface 512 is adhered to a rectangular pad. On the assumption that a is the short side of the pad upper surface and b is the long side of the pad upper surface, the maximum adhesion area of the ball formed on the pad is ab. At this time, the area of the pad upper surface 506 is ab. The maximum adhesion area of the ball formed on the pad is 100% of the pad upper surface 506.

When FIG. 6E is compared to FIGS. 6C and 6D, a difference between the occupations of the rectangular ball adhesion surface 512 and the circular ball adhesion surface 508 to the pad upper surface 506 is 1−aπ/4b. Therefore, the occupation ratio of the rectangular ball adhesion surface is larger than that of the circular ball adhesion surface. In addition, a difference between the occupations of the rectangular ball adhesion surface 512 and the square ball adhesion surface 510 to the pad upper surface 506 is 1−a/b. Therefore, the occupation ratio of the rectangular ball adhesion surface 512 is larger than that of the square ball adhesion surface 510.

According to FIGS. 6A through 6E, when the pad upper surface has substantially the same shape as that of the ball adhesion surface, a contact area between the pad upper surface and the ball adhesion surface increases. Accordingly, it is possible to improve the electrical contact reliability between the pad and the bonding structure.

Applied Examples

The bonding structures according to example embodiments are applicable to a semiconductor memory or a semiconductor non-memory. Hereinafter, an example will be described in which the bonding structure according to example embodiments is applied to a semiconductor memory.

Figure 7A:
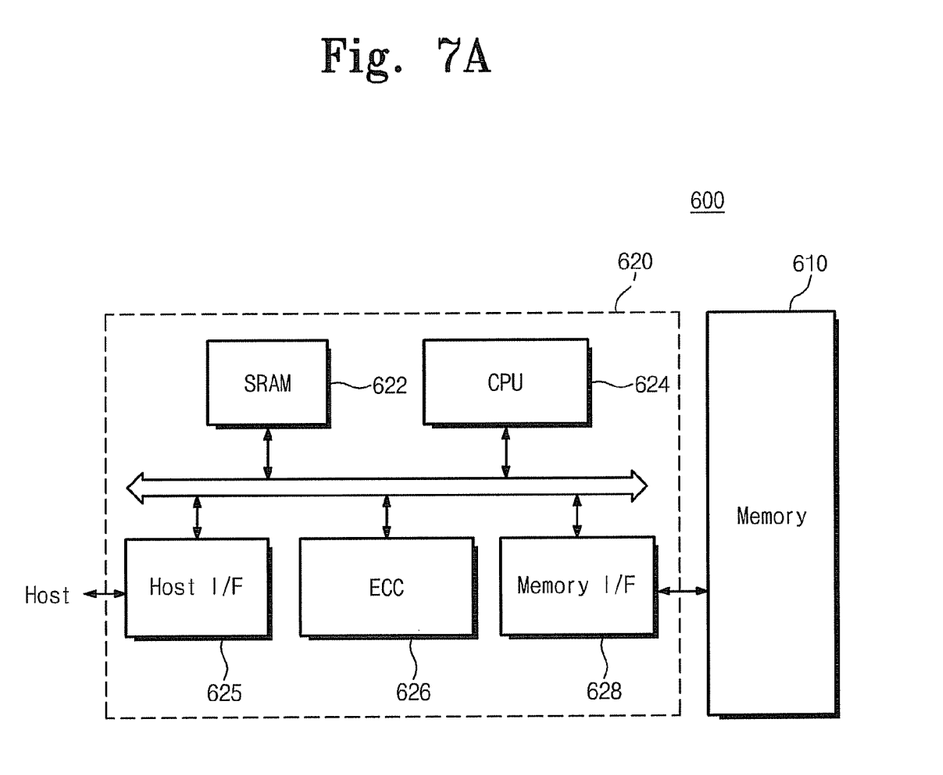
FIG. 7A is a block diagram illustrating a memory card including a bonding structure according to example embodiments.

FIG. 7A is a block diagram illustrating a memory card including the bonding structure according to example embodiments.

Referring to FIG. 7A, a semiconductor memory 610 including the bonding structure according to the above-described example embodiments is applicable to a memory card 600. As an example, the memory card 600 may include a memory controller 620 controlling a general data exchange between a host and a memory 610. An SRAM 622 may be used a work memory of a central processing unit 624. A host interface 625 may have a data exchange protocol of the host connected to the memory card 600. An error correction code 626 may detect and correct errors contained in data read out from the memory 610. A memory interface 628 interfaces with the memory 610. The central processing unit 624 performs a general control operation for data exchange of the memory controller 620.

Since the semiconductor memory 610 applied to the memory card 600 includes the bonding structure according to example embodiments, the contact area between the pad and the ball is larger in the case where the pad upper surface and the ball adhesion surface have the same shape the contact area between the pad and the ball than in the case where the pad upper surface and the ball adhesion surface have different shapes. Accordingly, it is possible to improve the electrical contact reliability between the pad and the bonding structure. As a consequence, it is possible to reduce the electrical resistance of the semiconductor memory including the bonding structure and applied to the memory card 600. Moreover, it is possible to improve the electrical driving force.

The bonding structure according to example embodiments is applicable to a memory system or a non-memory system. Hereinafter, an example will be described in which the bonding structure according to example embodiments is applied to a memory system.

Figure 7B:
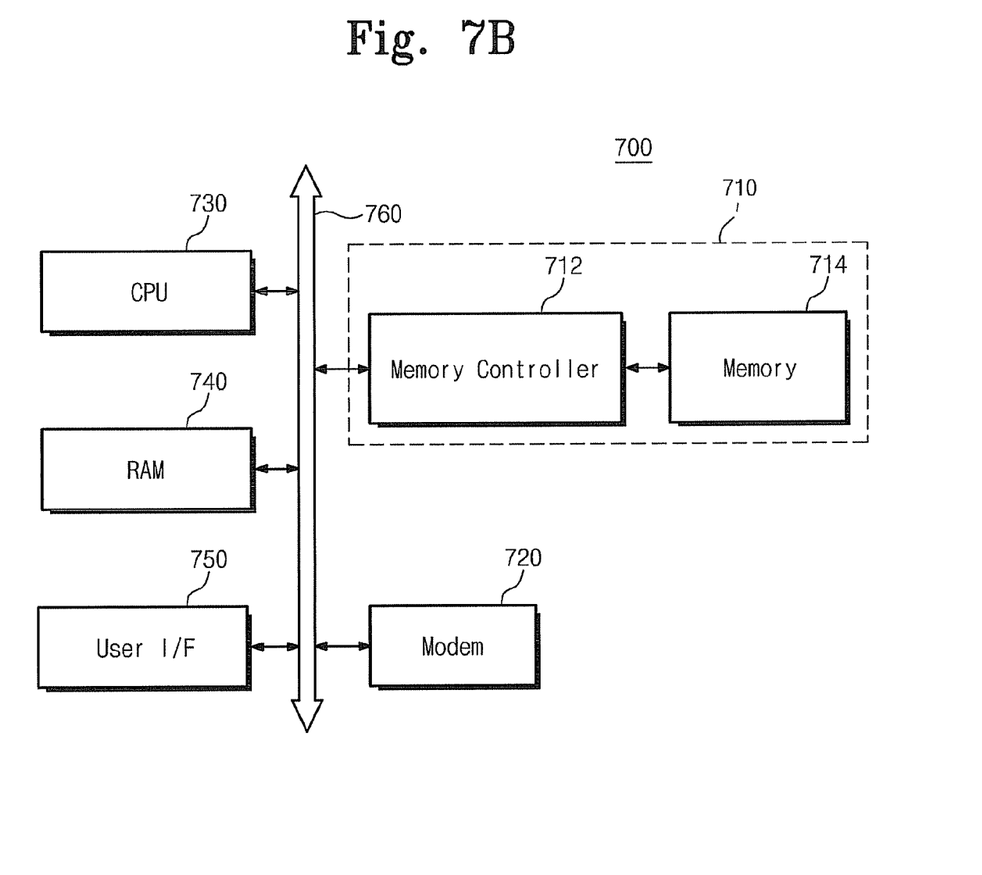
FIG. 7B is a block diagram illustrating an information processing system including a bonding structure according to example embodiments.

FIG. 7B is a block diagram illustrating an information processing system including a bonding structure according to example embodiments.

Referring to FIG. 7B, an information processing system 700 may include a memory system 710 including the bonding structure according to example embodiments. The information processing system 700 may include a mobile device and a computer. For example, the information processing system 700 may include the memory system 710, a modem 720, a central processing unit 730, a RAM 740, and a user interface 750 which are electrically connected to a system bus. The memory system 710 may include a memory 714 and a memory controller 712, and have substantially the same configuration as that of the memory card 600 of FIG. 7A. The memory system 710 may store data processed by the central processing unit 730 or data input from the outside. The information processing system 700 may be configured as the memory card 600, a semiconductor disk device (Solid State Disk), a camera image processor (Camera Image Sensor), and other application chipsets. For example, the memory system 710 may be configured as a semiconductor disk device (SSD).

In this case, the information processing system 700 may stably and reliably store a large amount of data in the memory system 710.

The semiconductor device according to example embodiments may be packaged in various forms. For example, the semiconductor device according to example embodiments may be packaged in forms such as Package on Package, Ball Grid Arrays, Chip Scale Packages, Plastic Leaded Chip Carrier, Plastic Dual In-Line Package, Multi Chip Package, Wafer Level Package, Wafer Level Fabricated Package, Wafer Level Stack Package, Die on Waffle Package, Die in Wafer Form, Chip on Board, Ceramic Dual In-Line Package, Plastic Metric Quad Flat Pack, Thin Quad Flat Pack, Small Outline Package, Shrink Small Outline Package, Thin Small Outline Package, Thin Quad Flat Package, and System In Package.

According to example embodiments, since the adhesion surface of the ball has substantially the same shape as that of the upper surface of the pad, it is possible to increase the contact area between the ball and the pad. Accordingly, it is possible to improve the electrical contact reliability by increasing the electrical contact area between the pad and the bonding structure.

Example embodiments have been described by referring to the accompanying drawings. However, it is apparent to those skilled in the art that example embodiments may be changed or modified in various forms within the scope of the inventive concepts without departing from the spirit and scope of the appended claims. Therefore, it is understood that the above-described example embodiments are exemplary in all respects and are not intended as limitations.

What is claimed is:

1. A bonding structure, comprising:
a pad including an upper surface having a first surface area;
a ball adhered directly to the upper surface of the pad; and
a wire extending from the ball;
wherein a shape of an adhesion surface of the ball is the same as a shape of the upper surface of the pad,
wherein the adhesion surface of the ball has a second surface area, and
wherein the first surface area is substantially the same as the second surface area.

2. The bonding structure of claim 1, wherein the shape of the upper surface of the pad is square,
wherein the shape of the adhesion surface of the ball is square, and
wherein the square shape of the adhesion surface of the ball has round corners.

3. The bonding structure of claim 1, wherein a width of the wire is less than a width of the ball.

4. The bonding structure of claim 1, further comprising:
a neck part between the ball and the wire.

5. The bonding structure of claim 1, wherein the shape of the upper surface of the pad is square, and
wherein the shape of the adhesion surface of the ball is square.

6. The bonding structure of claim 1, wherein the shape of the upper surface of the pad is rectangular, and
wherein the shape of the adhesion surface of the ball is rectangular.

7. The bonding structure of claim 1, wherein the shape of the upper surface of the pad is rectangular,
wherein the shape of the adhesion surface of the ball is rectangular, and
wherein the rectangular shape of the adhesion surface of the ball has round corners.

8. The bonding structure of claim 1, wherein the wire extends from the ball in a direction perpendicular to the upper surface of the pad.

* * * * *